United States Patent
Inoue et al.

(10) Patent No.: US 8,254,065 B2
(45) Date of Patent: Aug. 28, 2012

(54) FOR A PIEZOELECTRIC ACTUATOR HAVING AN ELECTRODE JOINED WITH THE JOINT FACE OF THE ACTUATOR MOVABLE MEMBER, A POWER SUPPLY INCLUDING A WIRING CONNECTOR HAVING A FACE JOINED WITH THE ELECTRODE AND ANOTHER FACE ATTACHED TO A CONDUCTIVE BASE LAYER OF A WIRING MEMBER AND HEAD SUSPENSION EMPLOYING THE SAME

(75) Inventors: Masaru Inoue, Aikoh-gun (JP); Shogo Imuta, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 87 days.

(21) Appl. No.: 12/872,409

(22) Filed: Aug. 31, 2010

(65) Prior Publication Data
US 2011/0051290 A1    Mar. 3, 2011

(30) Foreign Application Priority Data
Sep. 2, 2009   (JP) .................................. 2009-203074

(51) Int. Cl.
*G11B 5/56* (2006.01)
(52) U.S. Cl. .................................................. 360/294.4
(58) Field of Classification Search ............... 360/294.4, 360/245.8–246
See application file for complete search history.

(56) References Cited

U.S. PATENT DOCUMENTS

| 7,167,344 | B2 * | 1/2007 | Nakagawa et al. | ........ 360/294.4 |
| 7,440,236 | B1 * | 10/2008 | Bennin et al. | ............... 360/294.4 |
| 8,094,416 | B2 * | 1/2012 | Hanya et al. | ............... 360/294.4 |

FOREIGN PATENT DOCUMENTS

| JP | 10-293979 | 11/1998 |
| JP | 11-031368 | 2/1999 |
| JP | 2002-050140 | 2/2002 |

* cited by examiner

*Primary Examiner* — Allen Heinz
(74) *Attorney, Agent, or Firm* — Jordan and Hamburg LLP

(57) ABSTRACT

For a piezoelectric actuator in which, upon receiving electric power, a piezoelectric element causes a shear deformation to minutely move a movable member of the actuator relative to a base member of the actuator, a power supply includes a wiring member having an insulating layer, a wiring connector, a hole through at least the wiring member insulating layer, and a contact in the through hole. The wiring member has a conductive base layer, the insulating layer, and a conductor layer, the connector base layer having an insular part and a main part that is electrically isolated from the insular part. The wiring connector has a first face joined with an electrode of the piezoelectric element and a second face joined with the insular part. The contact electrically connects the conductor layer of the wiring member to the wiring connector and to the piezoelectric element.

7 Claims, 6 Drawing Sheets

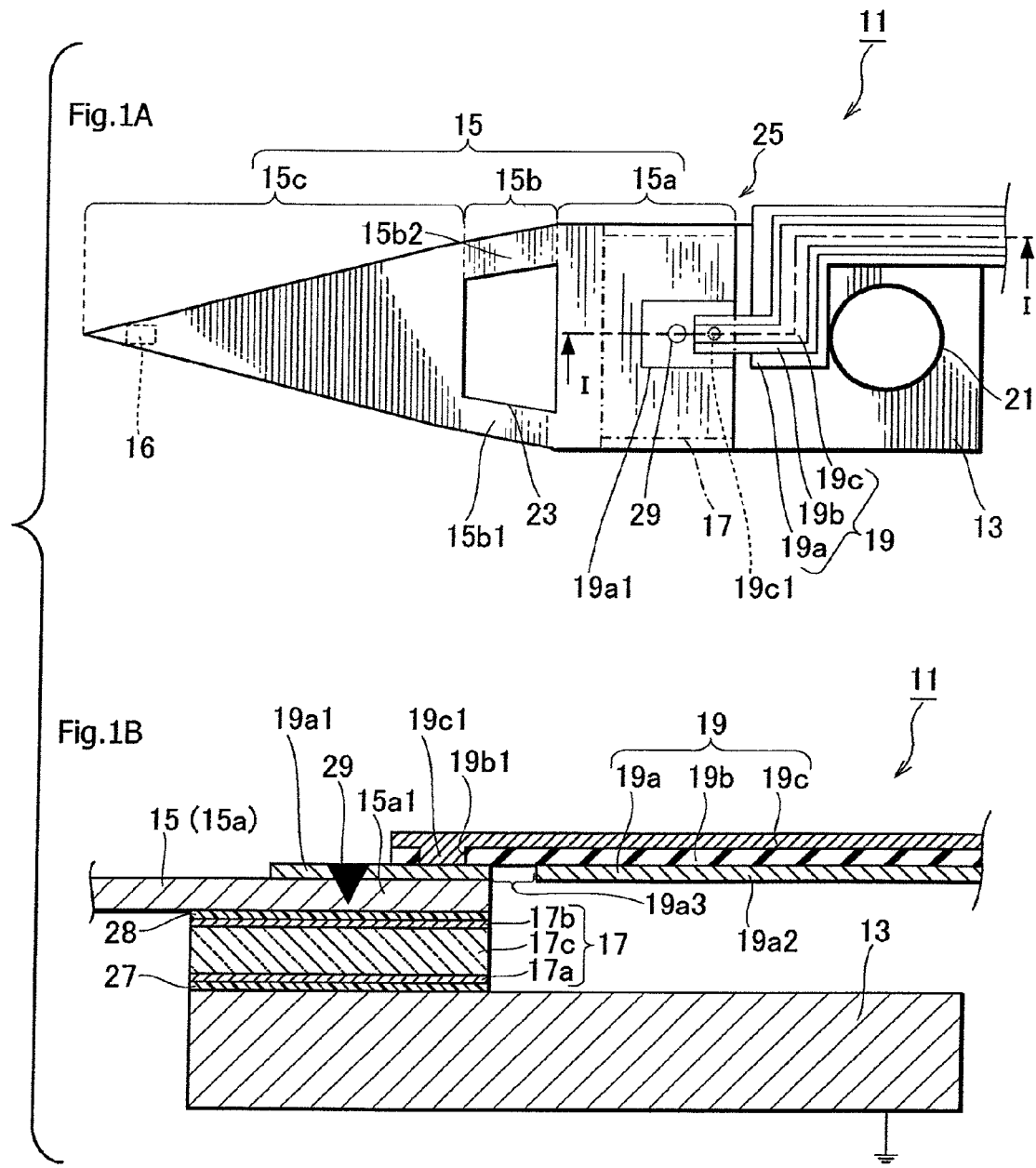

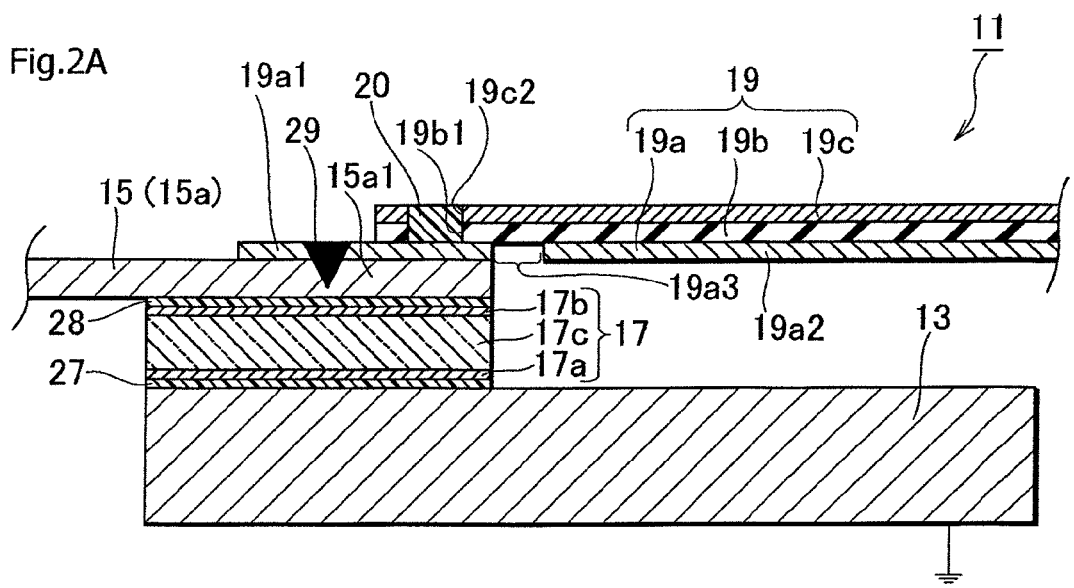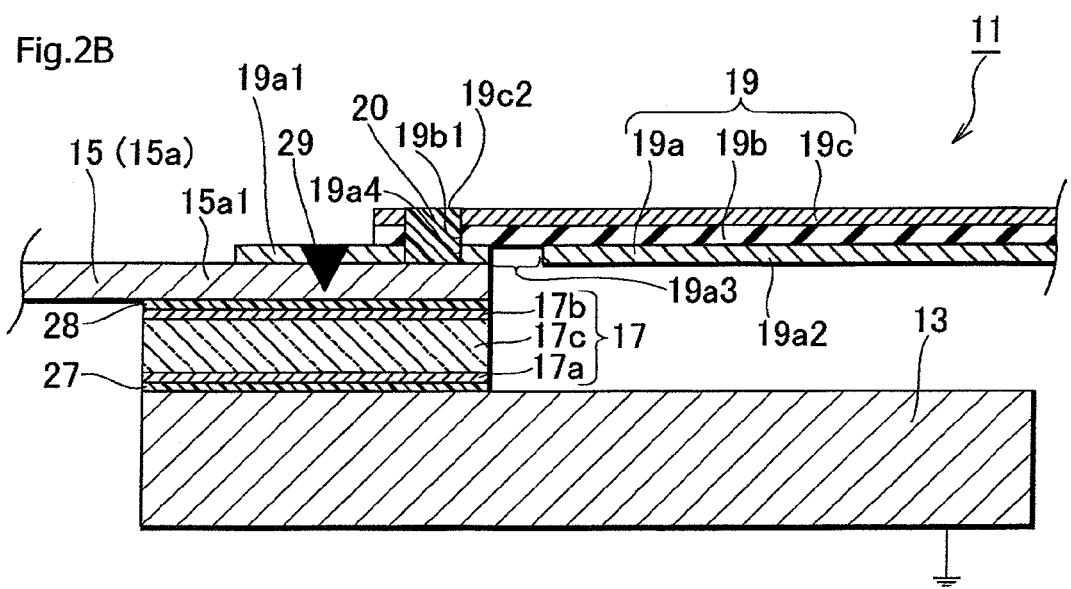

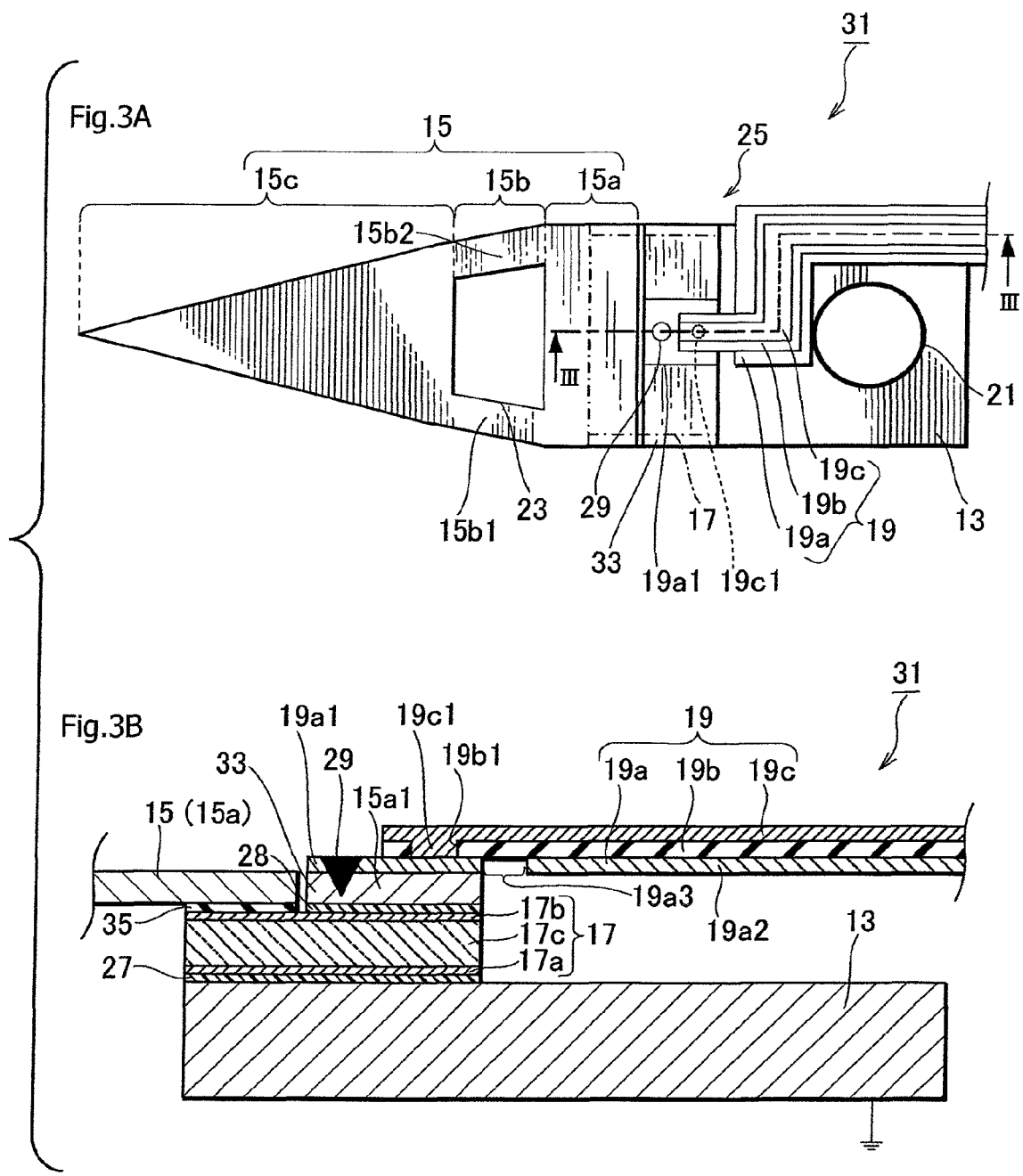

FOR A PIEZOELECTRIC ACTUATOR HAVING AN ELECTRODE JOINED WITH THE JOINT FACE OF THE ACTUATOR MOVABLE MEMBER, A POWER SUPPLY INCLUDING A WIRING CONNECTOR HAVING A FACE JOINED WITH THE ELECTRODE AND ANOTHER FACE ATTACHED TO A CONDUCTIVE BASE LAYER OF A WIRING MEMBER AND HEAD SUSPENSION EMPLOYING THE SAME

BACKGROUND OF THE INVENTION

1. Field of the Invention

The present invention relates to a power supply structure for a piezoelectric actuator that has a base member, a movable member, and a piezoelectric element arranged between the base member and the movable member and causes a shear deformation in response to a power applied state, as well as to a head suspension employing such a power supply structure.

2. Description of Related Art

Small-sized, precision information devices are rapidly advancing, and for use with such devices, needs for micro-actuators capable of conducting positioning control for very small distances are increasing. Such micro-actuators are highly needed by, for example, optical systems for correcting focuses and inclination angles, ink jet printers for controlling ink heads, and magnetic disk drives for controlling magnetic heads.

The magnetic disk drives are strongly expected to increase their storage capacities. Increasing the storage capacity of a magnetic disk drive is achievable by increasing the storage capacity of each magnetic disk in the magnetic disk drive. The storage capacity or recording density of a magnetic disk will increase, without changing the diameter thereof, if the number of tracks per inch (TPI) on the magnetic disk increases, i.e., if the width of a track narrows. For this, a magnetic head of a head suspension installed in the magnetic disk drive must conduct a precise positioning operation in a direction across the tracks, i.e., a sway direction. For realizing the precise positioning operation, an actuator capable of accurately moving and positioning the magnetic head within a very small section is needed.

To meet the need, Japanese Unexamined Patent Application Publication No. 2002-50140 proposes a head suspension for a disk drive. The head suspension includes a base plate, a connection plate having a hinge thinner than the base plate, a load beam provided with a flexure, and a piezoelectric actuator having a pair of piezoelectric elements.

This related art employs a dual actuator system that involves, for a precise positioning purpose, a voice coil motor and the piezoelectric actuator having two piezoelectric elements made of, for example, PZT (lead zirconate titanate).

The piezoelectric actuator in the dual actuator system minutely moves a front end of the load beam in a widthwise direction (sway direction) of the head suspension. Compared with a single actuator system employing only the voice coil motor, the dual actuator system employing the voice coil motor and piezoelectric actuator is capable of more precisely positioning a magnetic head attached to a front end of the head suspension.

The piezoelectric element described in the Japanese Unexamined Patent Application Publication No. 2002-50140 is of a compression type due to a deforming direction. On the other hand, Japanese Unexamined Patent Application Publication No. H10-293979 discloses a piezoelectric actuator employing a piezoelectric element of a shear type that demonstrates a shear deformation in response to a power supplied state when positioning a magnetic head.

An important issue for the head suspension employing the dual actuator system is how to supply power to the piezoelectric element. One approach to address the issue is disclosed in Japanese Unexamined Patent Application Publication No. H11-31368. To supply power to a shear type piezoelectric element, this related art forms a pair of wires on a base of a piezoelectric actuator and connects one of the wires to a first electrode of the piezoelectric element by wire bonding and the other wire to a second electrode of the piezoelectric element by wire bonding, as illustrated in FIG. 23 of the related art.

The wire bonding, however, applies local stress onto the piezoelectric element to secure bonding strength. The local stress onto the piezoelectric element tends to break the piezoelectric element. If the wire bonding is carried out moderately to prevent the breakage of the piezoelectric element, the bonding strength will be insufficient and deteriorate the reliability of electrical connection.

It is difficult for the related arts to prevent the breakage of a piezoelectric element, and at the same time, secure the reliability of electrical connection between power supply wiring and the piezoelectric element.

SUMMARY OF THE INVENTION

An object of the present invention is to provide a power supply structure for a piezoelectric actuator, capable of preventing the breakage of a piezoelectric element and securing the reliability of electrical connection between power supply wiring and the piezoelectric element, as well as a head suspension employing the power supply structure.

In order to accomplish the object, an aspect of the present invention provides a power supply structure for a piezoelectric actuator, the piezoelectric actuator having a conductive base member, a movable member, and a piezoelectric element, the piezoelectric element being arranged between the base member and the movable member and configured to cause a shear deformation to minutely move the movable member relative to the base member when receiving electric power. The power supply structure comprises the base member being electrically conductive and having a joint face to the piezoelectric element, the movable member having a joint face to the piezoelectric element, the piezoelectric element having first and second electrodes that are planar and arranged on opposite faces of the piezoelectric element, the first electrode being joined with the joint face of the base member so that they are electrically conductive to each other and the second electrode being joined with the joint face of the movable member, a wiring connector being electrically conductive and having first and second faces arranged opposite to each other, the first face being joined with the second electrode of the piezoelectric element so that they are electrically conductive to each other, a wiring member having a conductive base layer attached to the second face of the wiring connector, an insulating layer formed on the base layer, and a conductor layer formed on the insulating layer, the conductive base layer having an insular part for attachment to the wiring connector and a main part separated from the insular part, a through hole formed in the wiring member through at least the insulating layer of the wiring member, and a contact formed in the through hole, to electrically connect the conductor layer of the wiring member and the wiring connector to each other.

According to this aspect of the present invention, the insular part of the conductive base layer of the wiring member is fixed to the wiring connector that is joined with the second electrode of the piezoelectric element, to thereby join the wiring member with the piezoelectric element. The conductor layer of the wiring member is electrically connected to the wiring connector with the contact that is formed in the through hole formed through at least the insulating layer of the wiring member.

This aspect of the present invention is capable of connecting the wiring member to the piezoelectric element without damaging the piezoelectric element and securing the reliability of electrical connection between the wiring member and the piezoelectric element.

BRIEF DESCRIPTION OF THE DRAWINGS

FIG. 1A is a plan view illustrating a head suspension employing a power supply structure for a piezoelectric actuator according to a first embodiment of the present invention;

FIG. 1B is a sectional view taken along a line I-I of FIG. 1A;

FIGS. 2A and 2B are sectional views illustrating modifications of the first embodiment;

FIG. 3A is a plan view illustrating a head suspension employing a power supply structure for a piezoelectric actuator according to a second embodiment of the present invention;

FIG. 3B is a sectional view taken along a line III-III of FIG. 3A;

DETAILED DESCRIPTION OF EMBODIMENTS

Figure 4A:
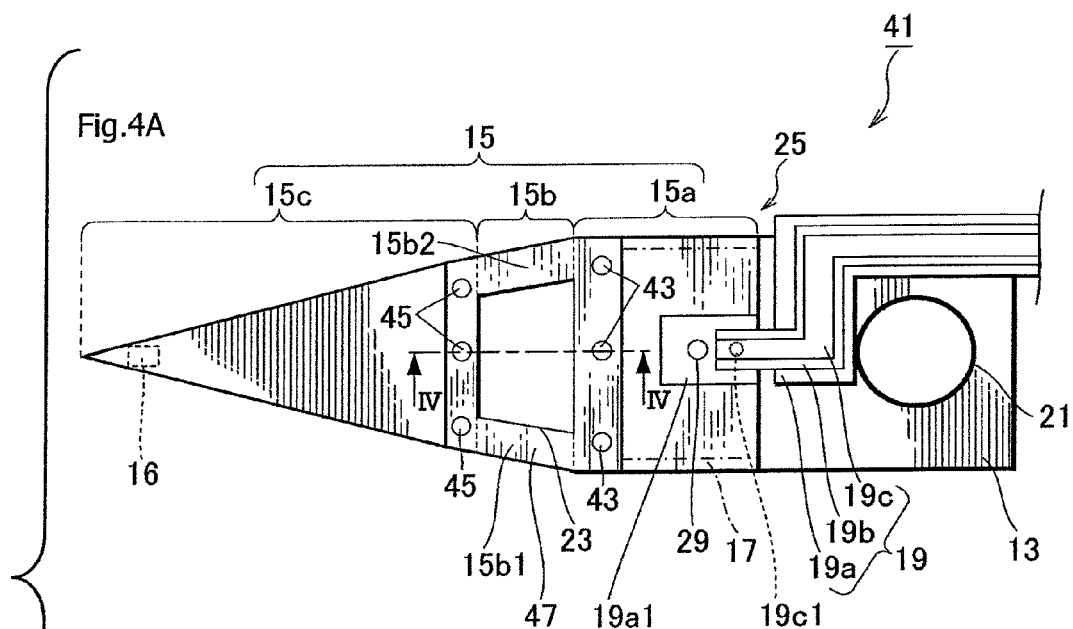
FIG. 4A is a plan view illustrating a head suspension employing a power supply structure for a piezoelectric actuator according to a third embodiment of the present invention.

Embodiments of the present invention will be explained in detail with reference to the drawings. Each embodiment of the present invention forms an insular part on a conductive base layer of a wiring member, fixes the insular part to a wiring connector that is joined with a second electrode of a piezoelectric element, and electrically connects a conductor layer of the wiring member to the wiring connector with a contact that is formed in a through hole formed through at least an insulating layer of the wiring member, thereby preventing the breakage of the piezoelectric element due to the connection of the wiring member and securing the reliability of electrical connection between the wiring member and the piezoelectric element.

A head suspension employing a power supply structure for a piezoelectric actuator according to the first embodiment of the present invention will be explained with reference to FIGS. 1A to 2B in which FIG. 1A is a plan view, FIG. 1B is a sectional view taken along a line I-I of FIG. 1A, and FIGS. 2A and 2B are sectional views illustrating modifications of the first embodiment.

In FIGS. 1A and 1B, the head suspension 11 has a base plate 13 as a base member, a load beam 15, a shear type piezoelectric actuator 17, and a wiring member 19.

The base plate 13 resiliently supports the load beam 15 and is a metal thin plate made of, for example, stainless steel and having a thickness of about 150 to 200 µm. The base plate 13 may be made of light metal such as aluminum alloy or a clad material including light metal and stainless steel.

The base plate 13 has a circular boss 21. With the boss 21, the base plate 13 is attached to a carriage (not illustrated) and is turned by a voice coil motor (not illustrated).

The load beam 15 applies load onto a head 16 that writes and reads information. The load beam 15 is a resilient metal thin plate made of, for example, stainless steel and has a thickness of about 30 to 150 µm. Like the base plate 13, the load beam 15 may be made of light metal such as aluminum alloy or a clad material including light metal and stainless steel.

The load beam 15 integrally has a base part 15a, a hinge part 15b, and a rigid part 15c. The base part 15a serves as a movable member that is joined with the piezoelectric element 17. The base part 15a integrally has a conductive wiring connector 15a1. The base part 15a and hinge part 15b form a resilient part for supporting the rigid part 15c to the base plate 13.

The load beam 15 has a trapezoidal window 23 adjacent to the base part 15a. On each side of the window 23, the hinge part 15b is defined. The hinge part 15b includes legs 15b1 and 15b2 that bend in a thickness direction. The window 23 functions to reduce the weight of the load beam 15 and weaken the bending rigidity thereof in the thickness direction.

The shear type piezoelectric element 17 is a rectangular plate and causes a shear deformation according to power supplied thereto. The piezoelectric element 17 is arranged between the conductive base plate 13 and the load beam 15.

The base plate 13, load beam 15, and piezoelectric element 17 form a piezoelectric actuator 25. The piezoelectric actuator 25 minutely moves a front end of the load beam 15 in a sway direction (a widthwise direction of the load beam 15) according to a shear deformation of the piezoelectric element 17 that occurs depending on power supplied to the piezoelectric element 17.

More precisely, the piezoelectric element 17 causes a shear deformation when a voltage is applied thereto, or when an applied voltage thereto is released, or depending on the level of a voltage applied thereto.

The piezoelectric element 17 has first and second electrodes 17a and 17b and a piezoelectric material 17c that is sandwiched between the electrodes 17a and 17b.

The first and second electrodes 17a and 17b each are planar and made of metal material having a low contact resistance, such as gold (Au). The piezoelectric material 17c causes a shear deformation when power is applied to the first and second electrodes 17a and 17b and is made of, for example, piezoelectric ceramics. The shear deformation of the piezoelectric material 17c occurs such that the first and second electrodes 17a and 17b move relative to each other in an in-plane direction.

The first electrode 17a of the piezoelectric element 17 is joined through a conductive adhesive layer 27 with a joint face formed on a front end part of the base plate 13, so that the first electrode 17a and the base plate 13 are electrically conductive to each other. The second electrode 17b of the piezoelectric element 17 is joined through a conductive adhesive layer 28 with a first face (joint face) of the wiring connector 15a1 that is integral with the load beam 15, so that the second electrode 17b and the wiring connector 15a1 are electrically conductive to each other.

The conductive adhesive layers 27 and 28 physically solidify the base plate 13, load beam 15, and piezoelectric element 17, to form the piezoelectric actuator 25. At the same time, the adhesive layers 27 and 28 secure electrical conductivity between the base plate 13 and the first electrode 17a of the piezoelectric element 17 and between the wiring connector 15a1 of the load beam 15 and the second electrode 17b of the piezoelectric element 17.

A second face of the wiring connector 15a1 of the load beam 15 is joined with the wiring member 19 to supply power to the second electrode 17b of the piezoelectric element 17. The wiring member 19 has a thickness of about 20 µm and includes, successively from the second face of the wiring connector 15a1, a conductive base layer 19a, an electrical insulating layer 19b, and a conductor layer 19c that are laid one on another. The wiring member 19 is fixed to the base plate 13 at predetermined positions by laser spot welding.

The conductive base layer 19a is made of a metal thin plate such as a stainless steel thin plate and includes an insular terminal 19a1 as an insular part and a main part 19a2.

The insular terminal 19a1 is fixed to the wiring connector 15a1 of the load beam 15 by laser spot welding at a weld spot 29. The insular terminal 19a1 is separated to be electrically isolated from the main part 19a2. Namely, the main part 19a2 is separated to be electrically isolated from the wiring connector 15a1 of the load beam 15.

The insulating layer 19b is made of a material having a good insulating ability, such as polyimide resin. The insulating layer 19b is provided with a cylindrical through hole 19b1 at a position corresponding to the insular terminal 19a1. The through hole 19b1 is filled with a contact 19c1 that is electrically connected to the insular terminal 19a1. The contact 19c1 is integral with the conductor layer 19c of the wiring member 19 and electrically connects, through the insular part 19a1, the conductor layer 19c of the wiring member 19 to the wiring connector 15a1 of the load beam 15.

The conductor layer 19c is made of a material having a good electrical conductivity, such as copper and nickel.

The through hole 19b1 is formed when forming the insulating layer 19b of the wiring member 19 with the use of a mask having a pattern corresponding to the shape of the through hole 19b1. Namely, the through hole 19b1 can be formed in a standard forming process without adding a special process.

The contact 19c1 is formed when forming the conductor layer 19c of the wiring member 19 with the use of a technique of burying the through hole 19b1, such as copper plating and nickel plating. Namely, the contact 19c1 can be formed in a standard forming process without adding a special process.

The power supply structure for the piezoelectric actuator 25 according to the first embodiment provides a power supply route extending along the base plate 13, the first and second electrodes 17a and 17b of the piezoelectric element 17, and the conductor layer 19c of the wiring member 19, to supply power to the piezoelectric element 17.

More precisely, the power supply route passes the base plate 13, the conductive adhesive layer 27, the first electrode 17a, piezoelectric material 17c, and second electrode 17b of the piezoelectric element 17, the conductive adhesive layer 28, the wiring connector 15a1 of the load beam 15, the insular terminal 19a1 of the conductive base layer 19a of the wiring member 19, the contact 19c1, and the conductor layer 19c.

According to the first embodiment, the base plate 13 is grounded and a deformation command signal is sent to the conductor layer 19c of the wiring member 19, to cause a shear deformation in the piezoelectric element 17. According to the deformation, the front end of the load beam 15 is moved for a very short distance in a sway direction.

According to the first embodiment, power supply to the piezoelectric element 17 is carried out through the contact 19c1 that electrically connects the conductor layer 19c of the wiring member 19 to the wiring connector 15a1 of the load beam 15. This configuration prevents the breakage of the piezoelectric element 17, secures the reliability of connection between the piezoelectric element 17 and the wiring member 19, and reduces the cost of the piezoelectric actuator 25.

According to the first embodiment, the wiring member 19 is fixed to the load beam 15 by metal-to-metal welding, i.e., by welding (laser spot welding) the insular terminal 19a1 of the conductive base layer 19a of the wiring member 19 to the wiring connector 15a1 of the load beam 15. This configuration heightens bonding strength between the wiring member 19 and the load beam 15 and secures electrical connection to the piezoelectric element 17.

According to the first embodiment, the metal-to-metal welding is carried out when welding the wiring member 19 to the base plate 13 during a standard assembling process of the head suspension 11. Namely, the metal-to-metal welding according to the first embodiment is achievable without adding a special process.

According to the first embodiment, the insular terminal 19a1 is separated by an etched part 19a3 from the main part 19a2 during a standard etching process of the conductive base layer 19a. Namely, the insular terminal 19a1 can be formed without adding a special process.

According to the first embodiment, the contact 19c1 is formed during a standard process of forming the conductor layer 19c of the wiring member 19 without adding a special process.

In this way, the first embodiment is achievable with the use of an existing manufacturing line as it is. Namely, the first embodiment is achievable without complicating the manufacturing line or increasing manufacturing cost.

Modifications of the contact 19c1 to connect the conductor layer 19c of the wiring member 19 to the wiring connector 15a1 of the load beam 15 will be explained with reference to FIGS. 2A and 2B.

In FIG. 2A, a first modification of the first embodiment forms a through hole 19c2 in the conductor layer 19c of the wiring member 19 in addition to the through hole 19b1 formed in the insulating layer 19b of the wiring member 19. The through hole 19c2 is coaxial with the through hole 19b1 and has the same diameter as the through hole 19b1.

The through holes 19b1 and 19c2 are filled with a conductive material such as a conductive adhesive 20, to secure electrical connection between the conductor layer 19c of the wiring member 19 and the wiring connector 15a1 of the load beam 15.

In FIG. 2B, a second modification of the first embodiment forms a through hole 19a4 in the conductive base layer 19a of the wiring member 19 in addition to the through hole 19b1 formed in the insulating layer 19b and the through hole 19c2 formed in the conductor layer 19c. The through hole 19a4 is on the insular terminal 19a, is coaxial with the through holes 19b1 and 19c2, and has the same diameter as the through holes 19b1 and 19c2.

The through holes 19b1, 19c2, and 19a4 are filled with a conductive material such as a conductive adhesive 20, to secure electrical connection between the conductor layer 19c of the wiring member 19 and the wiring connector 15a1 of the load beam 15.

The through hole 19a4 may have a larger diameter than the through holes 19b1 and 19c2. It is essential that the conductive adhesive 20 electrically connects the conductor layer 19c of the wiring member 19 to the wiring connector 15a1 of the load beam 15. It is not always necessary to electrically connect the conductive adhesive 20 to the conductive base layer 19a of the wiring member 19. In this case, the insular terminal 19a1 of the conductive base layer 19a functions only to fix the wiring member 19 to the wiring connector 15a1 of the load beam 15 and does not provide an electric terminal function.

In this way, the first and second modifications provide contact configurations different from the first embodiment.

According to the second modification, the conductive adhesive 20 extends from the conductor layer 19c of the wiring member 19 to the wiring connector 15a1 of the load beam 15, to directly electrically connect the conductor layer 19c to the wiring connector 15a1. This improves the reliability of electrical connection between the conductor layer 19c of the wiring member 19 and the wiring connector 15a1 of the load beam 15.

In this way, the power supply structure for a piezoelectric actuator according to any one of the first embodiment and modifications secures the electrical conductivity of a power supply route to the piezoelectric element 17, thereby improving the reliability of the head suspension employing the power supply structure.

A head suspension employing a power supply structure for a piezoelectric actuator according to the second embodiment of the present invention will be explained with reference to FIGS. 3A and 3B in which FIG. 3A is a plan view and FIG. 3B is a sectional view taken along a line of FIG. 3A.

The head suspension 31 according to the second embodiment is basically the same as the head suspension 11 of the first embodiment, and therefore, common parts are represented with the same reference marks as those used in the first embodiment and parts characteristic to the second embodiment will mainly be explained.

According to the first embodiment of FIGS. 1A and 1B, the head suspension 11 employs the wiring connector 15a1 that is integral with the base part 15a of the load beam 15 as the movable member.

According to the second embodiment, the head suspension 31 employs a wiring connector 15a1 that is separated from a base part 15a of a load beam 15 as the movable member.

The head suspension 31 of the second embodiment employs, as the conductive wiring connector 15a1, a conductive plate 33 that is separated from the load beam 15. The conductive plate 33 is a metal thin plate such as a stainless steel thin plate having a thickness of about 50 to 150 μm.

The conductive plate 33 is joined through a conductive adhesive layer 28 with a second electrode 17b of a piezoelectric element 17. An area of the second electrode 17b covered by the conductive adhesive layer 28 is rectangular and occupies, from a base edge of the second electrode 17b that is distal to the head, about ⅔ of the whole area of the second electrode 17b. This ⅔ rectangular area of the second electrode 17b contributes to about ⅓ of a shear deformation function of the piezoelectric element 17.

On the conductive plate 33, i.e., the wiring connector 15a1, an insular terminal 19a1 of a conductive base layer 19a of a wiring member 19 is laid and is fixed by laser spot welding (a weld spot 29). The insular terminal 19a1 is electrically connected through a contact 19c1 to a conductor layer 19c of the wiring member 19.

Similar to the first embodiment, the conductive plate 33, i.e., the wiring connector 15a1 electrically connects the second electrode 17b of the piezoelectric element 17 and the conductor layer 19c of the wiring member 19 to each other.

On the second electrode 17b of the piezoelectric element 17, the remaining ⅓ rectangular area from a front edge of the second electrode 17b that is proximal to the head is joined through a nonconductive adhesive layer 35 to the base part 15a of the load beam 15. Namely, the base part 15a of the load beam 15 is electrically insulated from the second electrode 17b and the load beam 15 is provided with the separated wiring connector 15a1. The ⅓ rectangular area of the second electrode 17b contributes to about ⅔ of the shear deformation function of the piezoelectric element 17.

The nonconductive adhesive layer 35 is formed from any known nonconductive adhesive or any known conductive adhesive mixed with insulating particles such as silica particles and glass particles. The nonconductive adhesive layer 35 electrically isolates the base part 15a of the load beam 15 from the second electrode 17b of the piezoelectric element 17.

Like the first embodiment, the second embodiment prevents the breakage of the piezoelectric element 17, improves the reliability of the power supply structure that joins the wiring member 19 with the piezoelectric element 17, and reduces the cost of the piezoelectric actuator 25.

The second embodiment is achievable with the use of an existing manufacturing line as it is. Namely, the second embodiment is achievable without complicating the manufacturing line or increasing manufacturing cost.

According to the second embodiment, the base part 15a of the load beam 15 is electrically isolated from the second electrode 17b of the piezoelectric element 17, and therefore, the second embodiment improves the degree of freedom in the electric potential designing of a load beam.

Like the head suspension 11 of the first embodiment, the head suspension 31 of the second embodiment secures the electrical conductivity of a power supply route to the piezoelectric element 17 and improves the reliability of the head suspension 31.

The second embodiment may employ the configurations of the conductive adhesive as the contact and the through holes of the first and second modifications of the first embodiment.

Figure 4B:
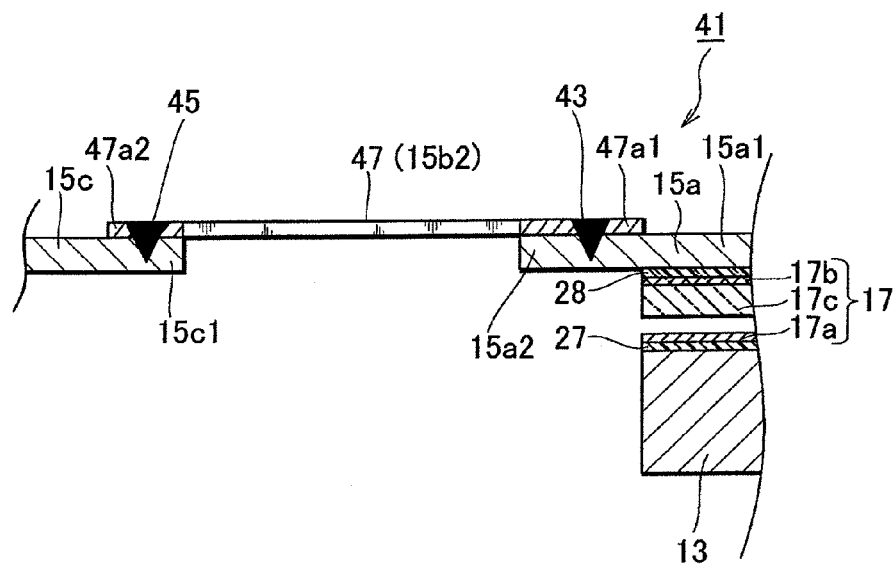
FIG. 4B is a sectional view taken along a line IV-IV of FIG. 4A.

A head suspension employing a power supply structure for a piezoelectric actuator according to the third embodiment of the present invention will be explained with reference to FIGS. 4A and 4B in which FIG. 4A is a plan view and FIG. 4B is a sectional view taken along a line IV-IV of FIG. 4A.

The head suspension 41 according to the third embodiment is basically the same as the head suspension 11 of the first embodiment, and therefore, common parts are represented with the same reference marks as those used in the first embodiment and parts characteristic to the third embodiment will mainly be explained.

According to the first embodiment of FIGS. 1A and 1B, the load beam 15 has the base part 15a, hinge part 15b, and rigid part 15c that are integral with one another.

According to the third embodiment, the head suspension 41 employs a load beam 15 having a base part 15a, a hinge plate 47, and a rigid part 15c that are discrete parts separated from one another. The hinge plate 47 includes a hinge part 15b.

The hinge plate 47 has legs 15b1 and 15b2 that connect the base part 15a and the rigid part 15c to each other.

A base end 47a1 of the hinge plate 47 is laid on a front end 15a2 of the base part 15a and is joined therewith by laser spot welding (weld spots 43) A front end 47a2 of the hinge plate 47 is laid on a base end 15c1 of the rigid part 15c and joined therewith by laser spot welding (weld spots 45).

The hinge plate 47 may be thinner than the base part 15a and rigid part 15c.

Like the first embodiment, the third embodiment prevents the breakage of a piezoelectric element 17, improves the reliability of the power supply structure that joins a wiring member 19 to the piezoelectric element 17, and reduces the cost of the piezoelectric actuator 25.

The third embodiment is achievable with the use of an existing manufacturing line as it is. Namely, the third embodiment is achievable without complicating the manufacturing line or increasing manufacturing cost.

Like the head suspension 11 of the first embodiment, the head suspension 41 of the third embodiment secures the electrical conductivity of a power supply route to the piezoelectric element 17, thereby improving the reliability of the head suspension 41.

The third embodiment may employ the configurations of the conductive adhesive as the contact and the through holes of the first and second modifications of the first embodiment.

The third embodiment may employ the divided structure of the second embodiment involving the load beam 15 and conductive plate 33 (wiring connector 15a1).

Figure 5A:
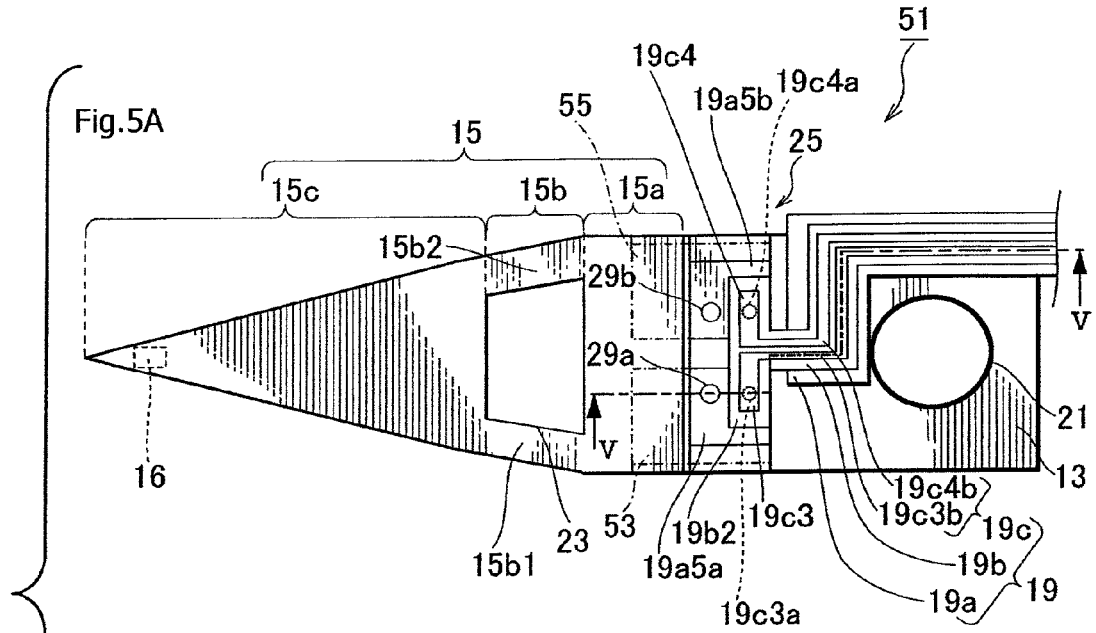
FIG. 5A is a plan view illustrating a head suspension employing a power supply structure for a piezoelectric actuator according to a fourth embodiment of the present invention.
Figure 5B:
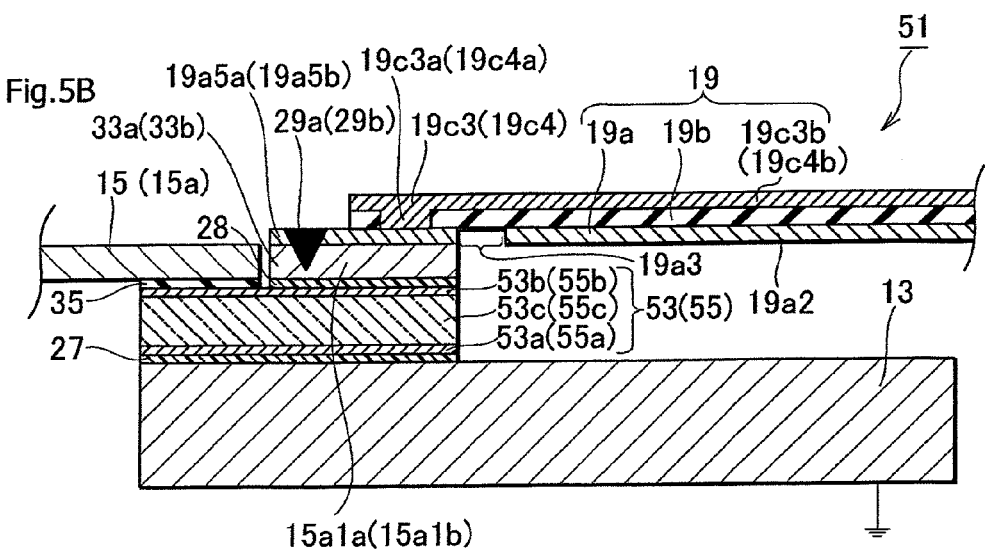
FIG. 5B is a sectional view taken along a line V-V of FIG. 5A.

A head suspension employing a power supply structure for a piezoelectric actuator according to the fourth embodiment of the present invention will be explained with reference to FIGS. 5A and 5B in which FIG. 5A is a plan view and FIG. 5B is a sectional view taken along a line V-V of FIG. 5A.

The head suspension 51 according to the fourth embodiment is basically the same as the head suspension 31 of the second embodiment, and therefore, common parts are represented with the same reference marks as those used in the second embodiment and parts characteristic to the fourth embodiment will mainly be explained.

According to the second embodiment of FIGS. 3A and 3B, the head suspension 31 includes the single piezoelectric element 17. According to the fourth embodiment of FIGS. 5A and 5B, the head suspension 51 includes first and second piezoelectric elements 53 and 55. These piezoelectric elements 53 and 55 have the same sectional structure, and therefore, FIG. 5B illustrates parts of the first piezoelectric element 53 with parts of the second piezoelectric element 55 put in parentheses.

The first and second piezoelectric elements 53 and 55 are arranged side by side in a direction in which a load beam 15 is minutely moved. The piezoelectric elements 53 and 55 have the same length, width, and height and are arranged at a widthwise central part of the head suspension 51 with a gap between the elements 53 and 55.

Like the first embodiment, the first piezoelectric element 53 has first and second electrodes 53a and 53b and a piezoelectric material 53c sandwiched between the electrodes 53a and 53b and the second piezoelectric element 55 has third and fourth electrodes 55a and 55b and a piezoelectric material 55c sandwiched between the electrodes 55a and 55b.

The power supply structure for the first and second piezoelectric elements 53 and 55 will be explained.

The first and third electrodes 53a and 55a of the first and second piezoelectric elements 53 and 55 are electrically connected through a conductive adhesive layer 27 to a base plate 13.

Each of the second and fourth electrodes 53b and 55b of the first and second piezoelectric elements 53 and 55 is electrically connected through a conductive adhesive layer 28 to a corresponding one of conductive plates 33a and 33b. The conductive adhesive layer 28 occupies, from a base edge of the electrode 53b (55b), about ⅔ of the whole area of the electrode 53b (55b).

On the conductive plate 33a (33b) corresponding to a wiring connector 15a1a (15a1b), an insular terminal 19a5a (19a5b) of a conductive base layer 19a of a wiring member 19 is laid and is joined by laser spot welding (weld spot 29a (29b)).

The insular terminal 19a5a (19a5b) is electrically connected through a contact 19c3a (19c3b) to a conductor 19c3b (19c4b) of a conductor layer 19c of the wiring member 19.

Like the embodiment 2, the conductive plate 33a (wiring connector 15a1a) electrically connects the second electrode 53b of the first piezoelectric element 53 to the conductor 19c3b of the wiring member 19 and the conductive plate 33b (wiring connector 15a1b) electrically connects the fourth electrode 55b of the second piezoelectric element 55 to the conductor 19c4b of the wiring member 19.

An area of each of the second and fourth electrodes 53b and 55b of the first and second piezoelectric elements 53 and 55, from a front edge of thereof that is proximal to the head, is rectangular and occupies about ⅓ of the whole area of each of the second and fourth electrodes 53b and 55b. This ⅓ rectangular area of each of the second and fourth electrodes 53b and 55b is connected through a nonconductive adhesive layer 35 to a base part 15a of the load beam 15. Namely, the load beam 15 (movable member) is joined with and electrically isolated from the first and second piezoelectric elements 53 and 55 through the nonconductive adhesive layer 35. The load beam 15 is separated from the wiring connectors 15a1a and 15a1b.

With the interposition of the nonconductive adhesive layer 35, the base part 15a of the load beam 15 is electrically isolated from the second and fourth electrodes 53b and 55b of the first and second piezoelectric elements 53 and 55.

According to the fourth embodiment, the piezoelectric elements 53 and 55 are arranged side by side in a direction in which the load beam 15 (movable member) is minutely moved. Even with this configuration, the power supply structure according to the fourth embodiment is capable of joining the wiring member 19 to the piezoelectric elements 53 and 55 without damaging the piezoelectric elements 53 and 55. Accordingly, the fourth embodiment is capable of securing the reliability of the piezoelectric actuator 25 and reducing the cost thereof.

The fourth embodiment is achievable with the use of an existing manufacturing line as it is. Namely, the fourth embodiment is achievable without complicating the manufacturing line or increasing manufacturing cost.

According to the fourth embodiment, the base part 15a of the load beam 15 is electrically isolated from the second and fourth electrodes 53b and 55b of the piezoelectric elements 53 and 55, and therefore, the fourth embodiment improves the degree of freedom in the electric potential designing of a load beam.

The fourth embodiment allows power to be individually supplied to the second and fourth electrodes 53b and 55b. With the base plate 13 grounded, separate power signals (shear deformation command signals) can be supplied through the conductors 19c3b and 19c4b of the conductor layer 19c to the second and fourth electrodes 53b and 55b of the first and second piezoelectric elements 53 and 55.

Then, the first and second piezoelectric elements 53 and 55 demonstrate shear deformations in response to the supplied signals, to drive the piezoelectric actuator 25 in such a way as to minutely move the front end of the load beam 15 in a sway direction.

Consequently, the fourth embodiment secures the degree of freedom in issuing shear deformation commands to the first and second piezoelectric elements 53 and 55.

Like the head suspension 31 of the second embodiment, the head suspension 51 of the fourth embodiment secures the electrical conductivity of a power supply route to the piezoelectric elements 53 and 55, thereby improving the reliability of the head suspension 51.

The fourth embodiment may employ the configurations of the conductive adhesive as the contact and the through holes of the first and second modifications of the first embodiment.

The fourth embodiment may employ the load beam of the first embodiment that is integrated with the wiring connector.

Also, the fourth embodiment may employ the load beam of the third embodiment.

Figure 6A:
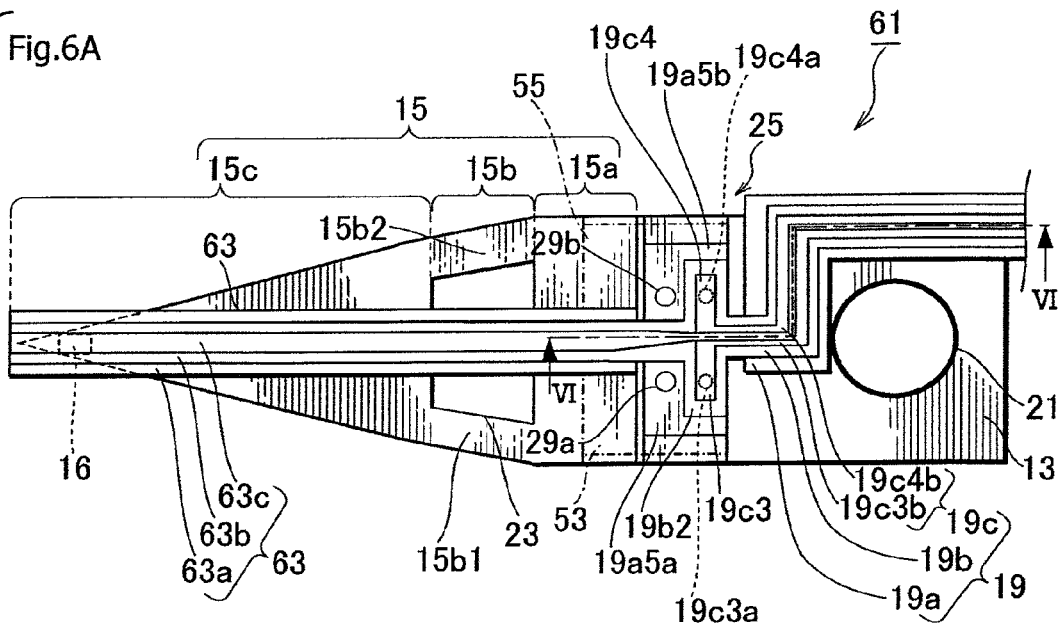
FIG. 6A is a plan view illustrating a head suspension employing a power supply structure for a piezoelectric actuator according to a fifth embodiment of the present invention.
Figure 6B:
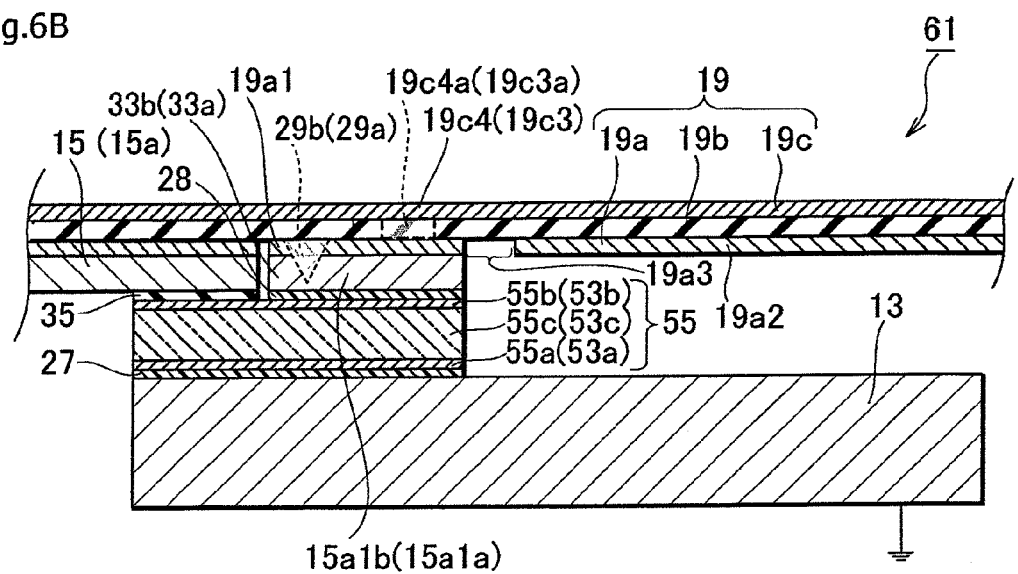
FIG. 6B is a sectional view taken along a line VI-VI of FIG. 6A.

A head suspension employing a power supply structure for a piezoelectric actuator according to the fifth embodiment of the present invention will be explained with reference to FIGS. 6A and 6B in which FIG. 6A is a plan view and FIG. 6B is a sectional view taken along a line VI-VI of FIG. 6A.

The head suspension 61 according to the fifth embodiment is basically the same as the head suspension 51 of the fourth embodiment, and therefore, common parts are represented with the same reference marks as those used in the fourth embodiment and parts characteristic to the fifth embodiment will mainly be explained.

According to the fourth embodiment of FIGS. 5A and 5B, the head suspension 51 includes the wiring member 19 that is extended from the base edge that is distal to the head to about ⅓ of the length of the first and second piezoelectric elements 53 and 55.

According to the fifth embodiment of FIGS. 6A and 6B, the head suspension 61 employs a wiring member 19 and a flexure 63 that are integral with each other. The flexure 63 is extended to a front end of a load beam 15. First and second piezoelectric elements 53 and 55 of the fifth embodiment have the same sectional structure, and therefore, FIG. 6B illustrates parts of the first piezoelectric element 53 with parts of the second piezoelectric element 55 put in parentheses.

The flexure 63 has a conductor layer 63c that is write/read wiring for a head 16. The flexure 63 supports the head 16 and is fixed to a rigid part 15c of the load beam 15 by laser spot welding.

The flexure 63 successively includes from the surface of the rigid part 15c of the load beam 15 a conductive base layer 63a, an insulating layer 63b, and the conductor layer 63c. The conductive base layer 63a, insulating layer 63b, and conductor layer 63c of the flexure 63 are integral with the conductive base layer 19a, insulating layer 19b, and conductor layer 19c of the wiring member 19, respectively.

According to the fifth embodiment, the piezoelectric elements 53 and 55 are arranged side by side in a direction in which the load beam 15 (movable member) is minutely moved, like the fourth embodiment. Even with this configuration, the power supply structure according to the fifth embodiment is capable of joining the wiring member 19 to the piezoelectric elements 53 and 55 without damaging the piezoelectric elements 53 and 55. Accordingly, the fifth embodiment is capable of securing the reliability of the piezoelectric actuator 25 and reducing the cost thereof.

The fifth embodiment is achievable with the use of an existing manufacturing line as it is. Namely, the fifth embodiment is achievable without complicating the manufacturing line or increasing manufacturing cost.

According to the fifth embodiment, the wiring member 19 and flexure 63 are integral with each other. This configuration reduces the number of parts and simplifies manufacturing processes.

Like the head suspension 51 of the fourth embodiment, the head suspension 61 of the fifth embodiment secures the electrical conductivity of a power supply route to the piezoelectric elements 53 and 55, thereby improving the reliability of the head suspension 61.

The fifth embodiment may employ the configurations of the conductive adhesive as the contact and the through holes of the first and second modifications of the first embodiment.

The fifth embodiment may employ the load beam of the first embodiment that is integrated with the wiring connector.

Also, the fifth embodiment may employ the load beam of the third embodiment. The integrated wiring member 19 and flexure 63 according to the fifth embodiment is applicable to any one of the first to third embodiments.

The present invention is not limited to the embodiments mentioned above. Various modifications of the embodiments will be possible based on the teachings of the claims and specification without departing from the gist and scope of the present invention. Power supply structures for piezoelectric actuators and head suspensions employing them according to such modifications also fall in the scope of the present invention.

For example, the wiring member 19 including the conductive base layer 19a, insulating layer 19b, and conductor layer 19c may entirely be coated with an insulating material such as polyimide resin. The flexure 63 may also be coated with such an insulating material.

According to the first embodiment, the first electrode 17a is electrically connected through the conductive adhesive layer 27 to a front end of the base plate 13 and the second electrode 17b is electrically connected through the conductive adhesive layer 28 to a base end of the load beam 15. Instead, the conductive adhesive layers 27 and 28 may be replaced with nonconductive adhesive layers, and when the conductive parts are attached through the nonconductive adhesive layers to each other, the conductive parts are press-bonded together so that the conductive parts are short-circuited to establish a conductive state between them.

What is claimed is:

1. A power supply structure for a piezoelectric actuator having a conductive base member, a movable member, and a piezoelectric element, the piezoelectric element being arranged between the base member and the movable member and configured to cause a shear deformation to minutely move the movable member relative to the base member when receiving electric power, the power supply structure comprising;

the base member being electrically conductive and having a joint face to the piezoelectric element;

the movable member having a joint face to the piezoelectric element;

the piezoelectric element having first and second electrodes that are planar and arranged on opposite faces of the piezoelectric element, the first electrode being joined with the joint face of the base member so that they are electrically conductive to each other and the second electrode being joined with the joint face of the movable member;

a wiring connector being electrically conductive and having first and second faces arranged opposite to each other, the first face being joined with the second electrode of the piezoelectric element so that they are electrically conductive to each other;

a wiring member having a conductive base layer attached to the second face of the wiring connector, an insulating layer formed on the base layer, and a conductor layer formed on the insulating layer, the conductive base layer having an insular part for attachment to the wiring connector and a main part separated from the insular part;

a through hole formed in the wiring member through at least the insulating layer of the wiring member; and a contact formed in the through hole, to electrically connect the conductor layer of the wiring member and the wiring connector to each other.

2. The power supply structure for a piezoelectric actuator of claim 1, further comprising:

the wiring connector integrated with the movable member;

an adhesive layer arranged between the base member and the piezoelectric element, to join them together; and an adhesive layer arranged between the movable member and wiring connector and the piezoelectric element, to join them together.

3. The power supply structure for a piezoelectric actuator of claim 2, wherein:

the adhesive layers each are electrically conductive.

4. The power supply structure for a piezoelectric actuator of claim 1, further comprising:

the wiring connector separated from the movable member; and a nonconductive adhesive layer arranged between the movable member and the piezoelectric element, to join them together.

5. The power supply structure for a piezoelectric actuator of claim 4, wherein the piezoelectric element includes two piezoelectric element pieces that are arranged side by side in a direction in which the movable member is minutely moved relative to the base member.

6. A head suspension provided with the power supply structure for a piezoelectric actuator of claim 1, comprising:

a base plate to be attached to a carriage and turned around a spindle;

a load beam having a resilient part and a rigid part and configured to apply load onto a data read/write head arranged at a front end of the load beam;

a flexure arranged on the rigid part of the load beam and supporting the head, the flexure having wiring to transmit data to and from the head;

the movable member of the power supply structure being an integral part or a discrete part connected to the resilient part of the load beam;

the base member of the power supply structure being the base plate that supports the load beam through the movable member and piezoelectric element; and the piezoelectric element causing a shear deformation in response to electric power supplied thereto, to minutely move the front end of the load beam in a sway direction relative to the base plate.

7. The head suspension of claim 6, wherein the flexure is integral with the wiring member of the power supply structure.

* * * * *